ETCHANT FOR PRECISION ETCHING OF SEMICONDUCTORS
Filed Nov. 1, 1967
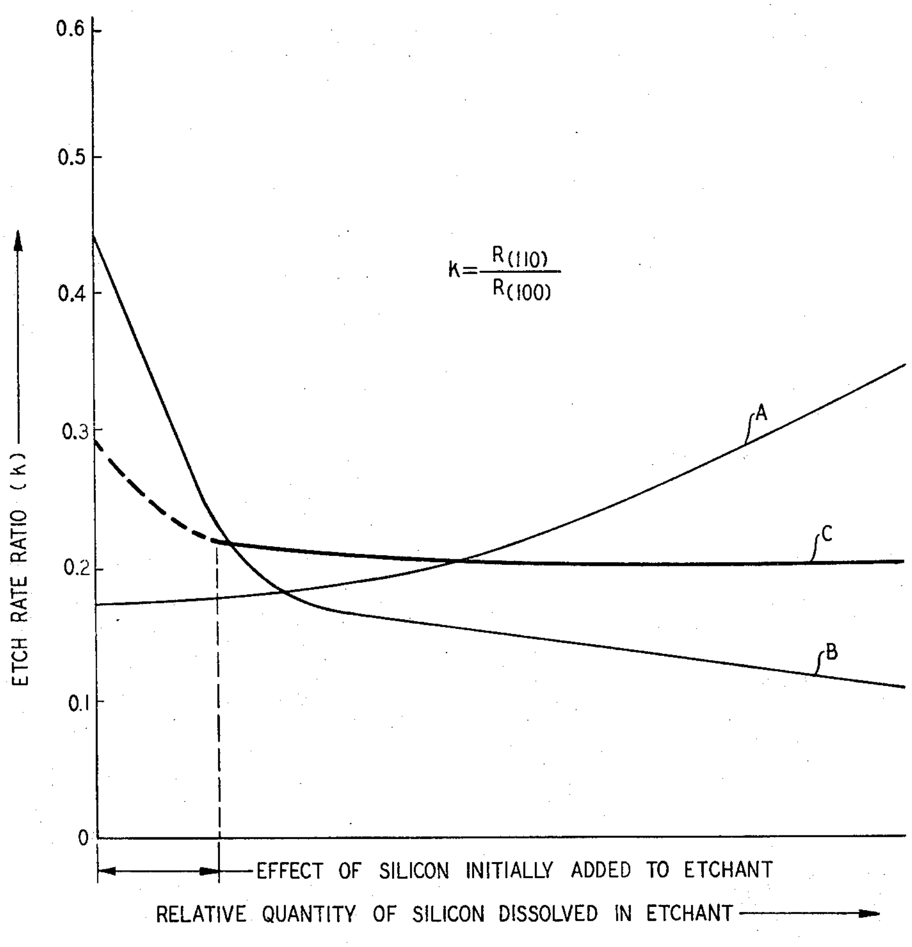
INVENTORS R. C. KRAGNESS
H. A. WAGGENER
BY H. W. Lockhart
ATTORNEY United States Patent Office 3,506,509
Patented Apr. 14, 1970

3,506,509
ETCHANT FOR PRECISION ETCHING OF SEMICONDUCTORS

Roger C. Kragness, Bethlehem, and Herbert A. Waggener, Allentown, Pa., assignors to Bell Telephone Laboratories, Incorporated, Murray Hill and Berkeley Heights, N.J., a corporation of New York Continuation-in-part of application Ser. No. 603,292, Dec. 20, 1966. This application Nov. 1, 1967, Ser. No. 679,818
Int. Cl. H01l 7/00
U.S. Cl. 156—17 3 Claims

ABSTRACT OF THE DISCLOSURE

A crystallographically preferential etchant for anisotropic etching of semiconductor single crystal material which includes two different alcohols. Hydroxide etchants containing a single alcohol have been proposed previously for anisotropic etching. These etchants attack, at a high rate, one of the three major crystallographic orientations typical of semiconducor crystals, another of the planes at a low or substantially zero rate and a third plane at an intermediate rate. The two alcohol etchant provides a more uniform rate of attack with respect to the plane having the intermediate etch rate, being less sensitive to potential efferts and the disturbing effects of etching by-product build-up.

CROSS REFERENCE TO RELATED APPLICATION

This application is a continuation-in-part of application, Ser. No. 603,292, filed Dec. 20, 1966.

BACKGROUND OF THE INVENTION

The above-identified application discloses the anisotropic etching of single crystal semiconductor material. The process as disclosed therein enables precise and controllable chemical etching of semiconductor bodies, for example, in connection with making isolating slots or grooves for beam leaded integrated circuit devices.

In particular, in connection with the disclosure identified above, etchants are formulated to have varying etch rates against the crystallographic planes predominant within the semiconductor crystal. By such formulation and the orientation of etch masks, material may be selectively removed from the semiconductor bodies with considerable preciseness and without the necessity of extensive process controls.

In particular, in the foregoing noted disclosure relating to the anisotropic etching of semiconductor bodies, crystallographically preferential etchants are disclosed based on mixtures of alkali hydroxides, water and an alcohol. One particular formulation comprised potassium hydroxide, water and n-propanol. This etchant exhibits a relatively high rate of attack relative to the (100) plane. It has a relatively low or zero rate with respect to the (111) plane and etches the (110) plane at a rate intermediate the rate with respect to the first two mentioned planes. As set forth in the disclosure previously filed, it is necessary that the etchant be formulated so as to have appreciable etch rate with respect to the (110) plane in order to alleviate the problem relating to the growth of pyramids resulting from certain perturbations in the crystalline material. It is this necessity which leads to the effect of undercutting at the corners of the etch masks and which is met by the use of compensating shapes at the corners of the etch mask.

In connection with the use of the single alcohol etchant, it has been observed that, particularly for the formulation including n-propanol, the rate of attack with respect to the (110) plane has a rising characteristic as the quantity of silicon semiconductor material dissolved in the etchant increases without a corresponding rise in the (100) etch rate. In particular, the rate of attack expressed as the ratio of the etch rate on the (110) plane to the etch rate on the (100) plane increases at a disadvantageous rate once a considerable amount of semiconductor material has gone into the solution. Accordingly, this effect places certain limitations on the use of this anisotropic process, making the correct corner compensation a function of the quantity of silicon dissolved in the etchant.

SUMMARY

In accordance with this invention it has been found that the foregoing described limitation relative to the rise in the etch rate with respect to undercutting of the corners may be alleviated by inclusion of a second alcohol in the etchant, which alcohol exhibits a decreasing rate of attack, as the amount of semiconductor material in solution increases. Thus, the effect of two alcohols with respect to the undercutting etch rate is to balance one another and render the process more amenable to control.

In particular, an etchment of the alkali hydroxide type, such as potassium hydroxide, may include a quantity of both n-propanol and secondary butanol so as to exhibit a substantially level etch rate as the amount of semiconductor material in solution increases beyond an initial small quantity of silicon.

The invention will be described in more detail in connection with the drawing, which is a graph illustrating the etch rates of various solutions with respect to the amount of semiconductor material in solution.

In the earlier disclosure referered to above, one suitable etchant formulation for use with monocrystalline silicon comprises a solution containing potassium hydroxide, (KOH) reagent grade, water, n-propanol, and a small amount of silicon. This formulation was designed for use with single crystal material in which the etch mask was oriented parallel to the (100) plane and had its orthogonally-disposed boundaries parallel to the intersections of the (111) planes with the (100) plane. Thus, this etchant exhibits a high rate of attack relative to the (100) plane, a very low rate with respect to the (111) plane and an intermediate rate with respect to the (110) plane. This particular etchant at a temperature of 85 degrees centigrade, has an etch rate ratio R in the range of 0.3 to 0.4 where the ratio is the rate of attack along a diagonal in the (100) plane divided by the rate of attack in the (100) plane. Specifically, this ratio R is equal to $K\sqrt{2}$, where $$K=R(110)/R(100)$$

This undercutting rate is noted for an arrangement in which metals are present in the solution as would be the case for the fabrication of beam leaded structures.

Referring to the drawing, the graph depicts in curve A the etching rate for this n-propanol etchant as the amount of semiconductor material in solution increases. The ordinate represents the etch rate ratio K expressed as the ratio of the etch rate against the (110) plane divided by the etch rate against the (100) plane. Accordingly, as previously disclosed, this ratio R starts at a level in the .3–.4 range corresponding to K in the range .21–.28. However, it will be seen that as the etching process proceeds and the amount of silicon in solution increases, the rate of attack begins to rise. Accordingly, the process must be controlled either by limiting the amount of etching or by reconditioning the etchant solution so as to continually reduce the amount of silicon in solution. Such steps are obviously disadvantageous.

If the foregoing described etchant is formulated using sescondary butanol as the alcohol in place of n-propanol, a characteristic such as that shown by curve B is attained. This etchant initially exhibits a very high rate of attack which rapidly decreases as the amount of silicon in solution increases and tends to level oil at a relatively low rate. This is an undesirable characteristic from the standpoint of the lack of control in the initial stages of the process, as well as by the relatively low etch rate exhibited at higher levels of solution. Moreover, such an etchant does not adequately dispose of the pyramid problem.

In accordance with this invention, an etchant formulated as follows has been found to exhibit a more advantageous etching characteristic: Etchant—250 grams potassium hydroxide, (KOH) reagent; 800 milliliters water; 25 milliliters n-propanol; 25 milliliters secondary butanol, 0.5 gram silicon.

In practice, this solution is maintained at a temperature of 84 degrees centigrade, and the one-half gram of silicon is added to effectively inhibit initial perturbations in the process. In other words, the addition of a small amount of silicon initially places the process slightly away from the point of origin and along the curve C of the graph which represents the characteristic of this two alcohol etchant. This characteristic as depicted by curve C has a substantially level rate of attack and consequently a high degree of controllability rendering operative steps such as reconditioning of the solution or repetitive term etching operations unnecessary.

Use of the etchant at a temperature of 84 degrees centigrade represents a recognition that the process and solution is relatively temperature sensitive and that the 84 degree point is a useful minimum, departures therefrom in either direction resulting in an increase in the etch rate ratio (K). The amount of each constituent is not critical and it is simply important that sufficient quantity of each alcohol be present to enable a complete solution.

It will be appreciated by those skilled in the art that although the disclosure has been presented in terms of n-propanol and a secondary butanol, mixtures of other alcohols may be advantageously used and particularly those alcohols of the propanol and butanol type. Specifically, it is required that an alcohol having a rising etch rate with respect to semiconductor material in solution be combined with an alcohol having a decreasing etch rate with respect to semiconductor material in solution so as to produce a substantially constant etch rate at a desired level. In particular, the etch rate R exhibited as curve C in the drawing lies in the range between .33 and .4 ($.23<K<.28$) which has been found to be most advantageous, representing a good balance between control of the corner etching and etching irregularities previously mentioned, namely pyramids. Moreover, the selection of a particular alcohol also effects the temperature of operation.

What is claimed is:

1. In the process of shaping by anistropic chemical etching a monocrystalline slice of silicon semiconductor material having as low order crystallographic planes the (100), (111) and (110), said slice having its two major surfaces in said (100) plane, forming an etch resistant mask on one of said major surfaces, the edges of said mask being parallel to the lines of intersection between the (100) plane and the (111) plane, applying an etchant comprising a solution of potassium hydroxide, water, n-propanol, secondary butanol, and a small quantity of silicon.

2. he method in accordance with claim 1 in which said small quantity of silicon is about 0.5 gram.

3. In the process in accordance with claim 2 applying said etchant at a temperature of about 80° C.

References Cited

UNITED STATES PATENTS

| | | | |
|---|---|---|---|
| 2,858,730 | 11/1958 | Hanson | 156—17 X |
| 3,041,226 | 6/1962 | Pennington | 156—17 |
| 3,425,879 | 2/1969 | Shaw et al. | 156—17 X |

JACOB H. STEINBERG, Primary Examiner

U.S. Cl. X.R.

252—79.5